United States Patent
Wong et al.

(10) Patent No.: US 8,249,277 B2
(45) Date of Patent: Aug. 21, 2012

(54) APPARATUS CAPABLE OF SWITCHING VOLUME ADJUSTMENT MODE AUTOMATICALLY AND VOLUME ADJUSTMENT METHOD THEREOF

(75) Inventors: Shih-Fang Wong, Taipei Hsien (TW); Tai-Chun Li, Shenzhen (CN); Bin He, Shenzhen (CN); Tsung-Jen Chuang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1099 days.

(21) Appl. No.: 12/141,887

(22) Filed: Jun. 18, 2008

(65) Prior Publication Data
US 2009/0022338 A1    Jan. 22, 2009

(30) Foreign Application Priority Data
Jul. 19, 2007    (CN) .......................... 2007 1 0201133

(51) Int. Cl.
*H03G 3/00*    (2006.01)
*H03G 9/00*    (2006.01)
(52) U.S. Cl. .......................... 381/107; 381/102; 381/104
(58) Field of Classification Search ........... 381/102–109
See application file for complete search history.

(56) References Cited

U.S. PATENT DOCUMENTS

| | | | | |
|---|---|---|---|---|
| 4,363,001 A * | 12/1982 | Suzuki et al. | ................. | 330/107 |
| 4,549,098 A * | 10/1985 | Fushiki | ............................ | 327/93 |
| 4,611,344 A * | 9/1986 | Hayama et al. | ................ | 381/109 |
| 4,706,294 A * | 11/1987 | Ouchida | ........................ | 381/109 |
| 4,710,962 A * | 12/1987 | Matsui | .......................... | 381/102 |
| 4,731,851 A * | 3/1988 | Christopher | ................... | 381/104 |
| 5,046,107 A * | 9/1991 | Iwamatsu | ...................... | 381/107 |
| 5,130,665 A * | 7/1992 | Walden | ......................... | 381/104 |
| 5,189,705 A * | 2/1993 | Lavaud | .......................... | 381/104 |
| 5,245,668 A * | 9/1993 | Kirchlechner | ................ | 381/109 |
| 5,303,371 A * | 4/1994 | Nakajima | ...................... | 381/109 |
| 5,355,531 A * | 10/1994 | Iwata et al. | .................... | 381/109 |
| 5,410,265 A * | 4/1995 | Jain et al. | ........................... | 330/2 |
| 5,513,268 A * | 4/1996 | Bironas et al. | ................. | 381/109 |
| 5,596,651 A * | 1/1997 | Yamaguchi | ..................... | 381/104 |
| 5,633,940 A * | 5/1997 | Wassink | ......................... | 381/107 |
| 5,640,460 A * | 6/1997 | May et al. | ...................... | 381/104 |

(Continued)

FOREIGN PATENT DOCUMENTS

CN    1335693    2/2002

(Continued)

*Primary Examiner* — Devona Faulk
(74) *Attorney, Agent, or Firm* — Altis Law Group, Inc.

(57) ABSTRACT

A method for automatically switching volume adjustment mode of an electronic device is provided. The method includes: storing a first predetermined volume and a second predetermined volume; when receiving a signal for volume adjustments, judging a current adjustment mode of the electronic device; if the current adjustment mode is the heavy adjustment mode, adjusting the volume with larger increment/decrement; if a value of the volume is larger than or equal to the first predetermined volume, switching to the light adjustment mode automatically; if the adjustment mode is the light adjustment mode, adjusting the volume with smaller increment/decrement; if the volume is less than or equal to the second predetermined volume, switching to the heavy adjustment mode automatically. The present invention also provides an electronic device capable of switching volume adjustment mode automatically.

5 Claims, 3 Drawing Sheets

U.S. PATENT DOCUMENTS

| | | | | |
|---|---|---|---|---|
| 5,745,057 A * | 4/1998 | Sasaki et al. | | 341/35 |
| 5,796,852 A * | 8/1998 | Yamaguchi | | 381/104 |
| 5,808,575 A * | 9/1998 | Himeno et al. | | 341/139 |
| 6,061,455 A * | 5/2000 | Hadley et al. | | 381/57 |
| 6,088,461 A * | 7/2000 | Lin et al. | | 381/104 |
| 6,442,281 B2 * | 8/2002 | Sato et al. | | 381/102 |
| 6,535,611 B1 * | 3/2003 | Lau | | 381/104 |
| 6,760,635 B1 * | 7/2004 | Bates et al. | | 700/94 |
| 6,831,657 B2 * | 12/2004 | Tsutsumi et al. | | 345/589 |
| 6,914,990 B2 * | 7/2005 | Abe | | 381/104 |
| 7,058,183 B2 * | 6/2006 | Hasegawa et al. | | 381/86 |
| 7,085,477 B2 * | 8/2006 | Fujii et al. | | 381/104 |
| 7,230,230 B2 * | 6/2007 | Funada et al. | | 250/231.14 |
| 2001/0026624 A1 * | 10/2001 | Kon et al. | | 381/104 |
| 2002/0031236 A1 * | 3/2002 | Shimizu et al. | | 381/104 |
| 2002/0141604 A1 * | 10/2002 | Abe | | 381/104 |
| 2004/0022401 A1 * | 2/2004 | Watanabe et al. | | 381/104 |
| 2004/0052385 A1 * | 3/2004 | Lim et al. | | 381/104 |
| 2004/0080489 A1 * | 4/2004 | Inui et al. | | 345/156 |
| 2005/0180585 A1 * | 8/2005 | Hsieh | | 381/104 |
| 2005/0207594 A1 * | 9/2005 | Uehara et al. | | 381/104 |
| 2005/0276426 A1 * | 12/2005 | Ono et al. | | 381/104 |
| 2006/0013414 A1 * | 1/2006 | Shih | | 381/107 |
| 2006/0050899 A1 * | 3/2006 | Hsieh | | 381/107 |
| 2006/0072769 A1 * | 4/2006 | Taniguchi | | 381/104 |
| 2007/0206820 A1 * | 9/2007 | Ikawa | | 381/104 |

FOREIGN PATENT DOCUMENTS

| | | |
|---|---|---|
| CN | 1780155 | 5/2006 |
| CN | 1901646 A | 1/2007 |

* cited by examiner the # APPARATUS CAPABLE OF SWITCHING VOLUME ADJUSTMENT MODE AUTOMATICALLY AND VOLUME ADJUSTMENT METHOD THEREOF

BACKGROUND

1. Technical Field

The present invention relates to volume adjustments, and particularly to a apparatus capable of switching volume adjustment mode automatically and a method thereof.

2. General Background

Today, handheld devices (e.g., mobile phone) are becoming more multifunctional (e.g., mobile phone with MP3 player and radio), people usually use the handheld device to enjoy music or listen to broadcasting, when people enjoy music or listen to broadcasting, adjusting the volume to a suitable level is necessary. However, the volume adjusting component, of many handheld devices, could only adjust the volume at fixed increments/decrements. Some volume adjusting elements have five or six fixed steps from the minimum volume to the maximum volume setting, so setting a comfortable volume level may not be achievable if the comfortable volume level falls between the steps.

Some mobile phones have two adjustment modes, a heavy adjustment mode and a light adjustment mode. In the heavy adjustment mode, the volume change range is large, and in the light adjustment mode, the volume change range is small. The mobile phone distinguishes heavy adjustment mode and light adjustment mode by the speed of rotation of the volume knob. When the speed of rotation of the knob is rapid, it is in the heavy volume adjustment mode, and when the speed of rotation of the knob is gradual, it is in the light volume adjustment mode. Other mobile phones also have heavy adjustment mode and light adjustment mode. However, heavy adjustment mode or light adjustment mode is determined by the length of time when a key is pressed. When the key is pressed for a short duration, it is in the heavy adjustment mode, and when the key is pressed for a long duration, it is in the light adjustment mode.

However, no matter rotating a knob or pressing a key, it could be an annoyance or may even damage the user's hearing when the volume is increased suddenly.

According to this, it is necessary to provide an apparatus and method to overcome the above-identified deficiencies.

SUMMARY

The present invention provides an apparatus and a method to adjust volume safely and suitably, when the volume is adjusted in large steps, the changing current volume adjustment mode is regulated from a heavy adjustment mode to a light adjustment mode automatically, thus avoiding damage to the hearing of the user.

A method for switching adjustment mode automatically, includes: obtaining a value of an identifier and judging the volume adjustment mode according to the value of the identifier in response to an adjustment operation; judging the volume adjustment mode is a heavy adjustment mode and adjusting volume in the heavy adjustment mode if the value of the identifier is a first value, or judging the volume adjustment mode is a light adjustment mode and adjusting volume in the light adjustment mode if the value of the identifier is a second value; comparing the current volume with a first predetermined volume; and if the current volume is not less than the first predetermined volume and the current adjustment mode is the heavy adjustment mode, changing the value of the identifier from the first value to the second value, thereby switching the current adjustment mode from the heavy adjustment to the light adjustment mode.

An apparatus capable of switching volume adjustment mode automatically is also provided.

BRIEF DESCRIPTION OF THE DRAWINGS

The components in the drawings are not necessarily drawn to scale, the emphasis instead being placed upon clearly illustrating the principles of the apparatus. Moreover, in the drawings, like reference numerals designate corresponding parts throughout the several views.

DETAILED DESCRIPTION OF THE EMBODIMENT

Figure 1:
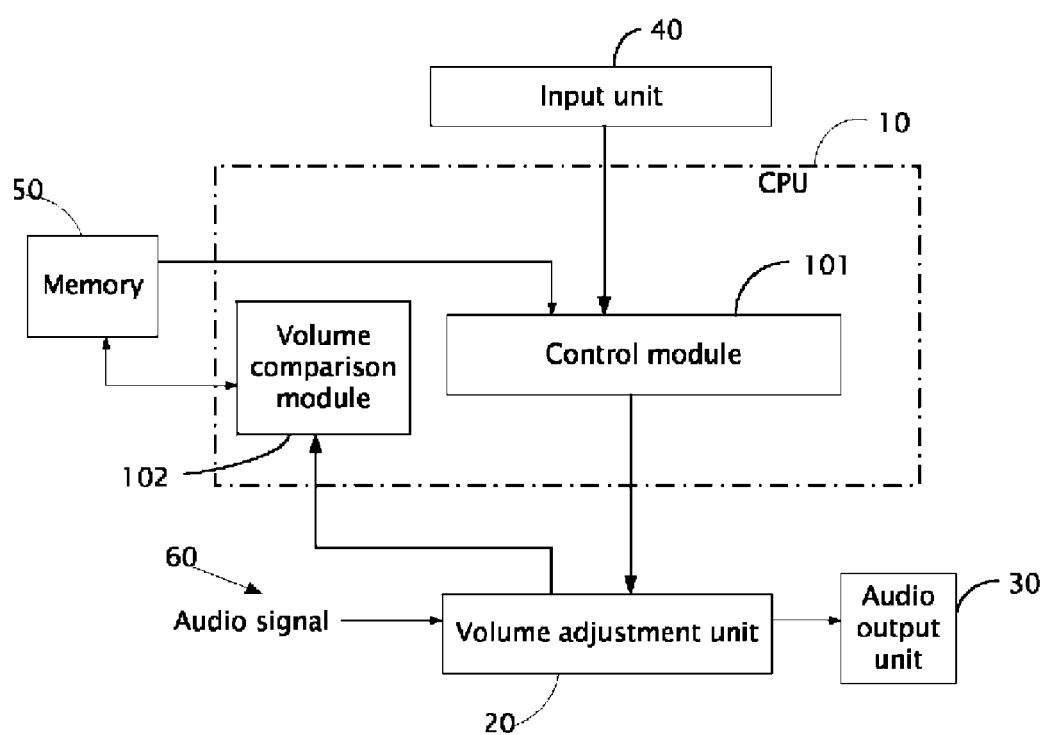
FIG. 1 is a block diagram of an apparatus capable of switching a volume adjustment mode.

FIG. 1 is a block diagram of an apparatus capable of switching volume adjustment mode in accordance with an exemplary embodiment of the present invention. The apparatus includes a central processing unit (CPU) 10, a volume adjustment unit 20, an audio output unit 30, an input unit 40, and a memory 50. The input unit 40 is used to generate signals in response to user's operations. For example, when receiving a volume adjustment operation, the input unit 40 generates a volume adjustment signal. The input unit 40 can be an input key (button), a knob, and the like. The memory 50 stores an identifier, a first predetermined volume, and a second predetermined volume. The identifier has a first value and a second value. The first value, e.g., "1", indicates the current adjustment mode of the volume is a heavy adjustment mode which has a larger adjustment unit (e.g., 10 db), while the second value, e.g., "0", indicates a current adjustment mode of the volume is a light adjustment mode which has a smaller adjustment unit (e.g., 1 db). The first predetermined volume and the second predetermined volume can be set by the user or can be provided by the apparatus. For example, the apparatus provides 90 db (decibel) as a default value of the first predetermined volume, and provides 70 db as a default value of the second predetermined volume.

The CPU 10 includes a control module 101 and a volume comparison module 102. The control module 101 receives the volume adjustment signal, and detects the value of the identifier. When the value of the identifier is "1", the control module 101 determines that the adjustment mode is the heavy adjustment mode, and transmits a heavy adjustment signal to the volume adjustment unit 20. The volume adjustment unit 20 adjusts the volume in a larger range according to the heavy adjustment signal. In other words, in the heavy adjustment mode, the volume can be adjusted with larger increments/decrements.

When the control module 101 detects the value of the identifier is "0", the control module 101 detects the adjustment mode is the light adjustment mode, and transmits a light adjustment signal to the volume adjustment unit 20. The volume adjustment unit 20 adjusts the volume in a smaller step according to the light adjustment signal. In other words, in the light adjustment mode, the volume can be adjusted with smaller increments/decrements.

Figure 2:
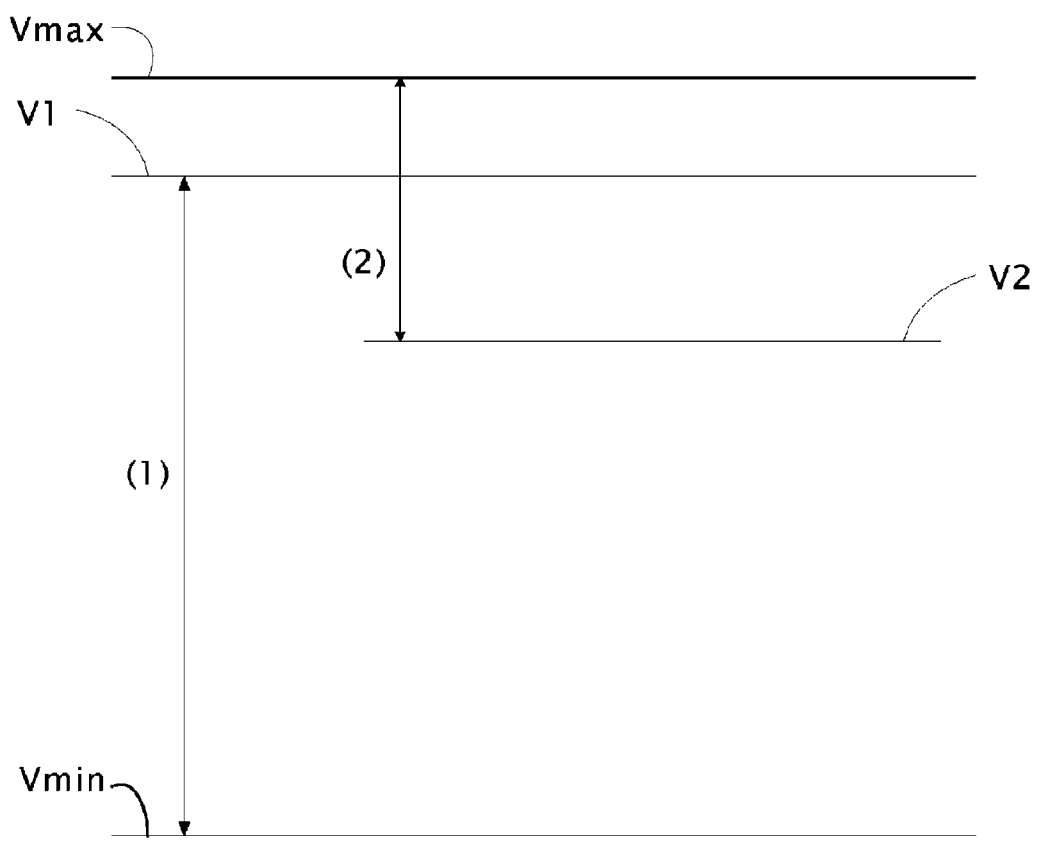
FIG. 2 is a graph of switching a volume adjustment mode in accordance with an exemplary embodiment of the present invention.

FIG. 2 is a graph of switching the volume adjustment mode implemented by the apparatus of FIG. 1 in accordance with an exemplary embodiment of the present invention. When receiving the volume adjustment signal, the control module 101 detects the value of the identifier. During a state (1) where the value of the identifier is "1", namely current adjustment mode is the heavy adjustment mode, and the current volume is between a range from the minimum volume (Vmin) and the first predetermined volume V1, the control module 101 transmits the heavy adjustment signal to control the volume adjustment unit 20 to adjust the volume in the heavy adjustment mode. After the volume adjustment, the volume comparison module 102 determines whether the current volume is greater than or equal to the first predetermined volume V1. If so, the volume comparison module 102 switches the heavy adjustment mode to the light adjustment mode, namely the volume comparison module 102 changes the value of the identifier from "1" to "0". Otherwise, the volume comparison module 102 keeps the current adjustment mode.

During a state (2) where the control module 101 detects the value of the identifier is "0", namely the current volume adjustment mode is the light adjustment mode, and the current volume is between a range from the second predetermined volume V2 and the maximum volume (Vmax), the control module 101 transmits a light adjustment signal to control the volume adjustment unit 20 to adjust the volume in the light adjustment mode. After the volume adjustment, the volume comparison module 102 judges whether the current volume is less than or equal to the second predetermined volume V2. If so, the volume comparison module 102 switches the light adjustment mode to the heavy adjustment mode, namely the volume comparison module 102 changes the value of the identifier from "0" to "1". Otherwise, the volume comparison module 102 keeps the current adjustment mode.

When the volume is between the range from the minimum volume and the first predetermined volume, the present invention can adjust the volume at larger increments/decrements to quickly obtain a large volume change through the heavy adjustment mode. When the volume is greater than or equal to the first predetermined volume, the heavy adjustment mode switches to the light adjustment mode automatically, and thus effectively preventing damage to the hearing of the user due to a sudden large change in volume. Furthermore, a small volume change through the light adjustment mode when the volume is between the range from the second predetermined volume and the maximum volume can be achieved.

Figure 3:
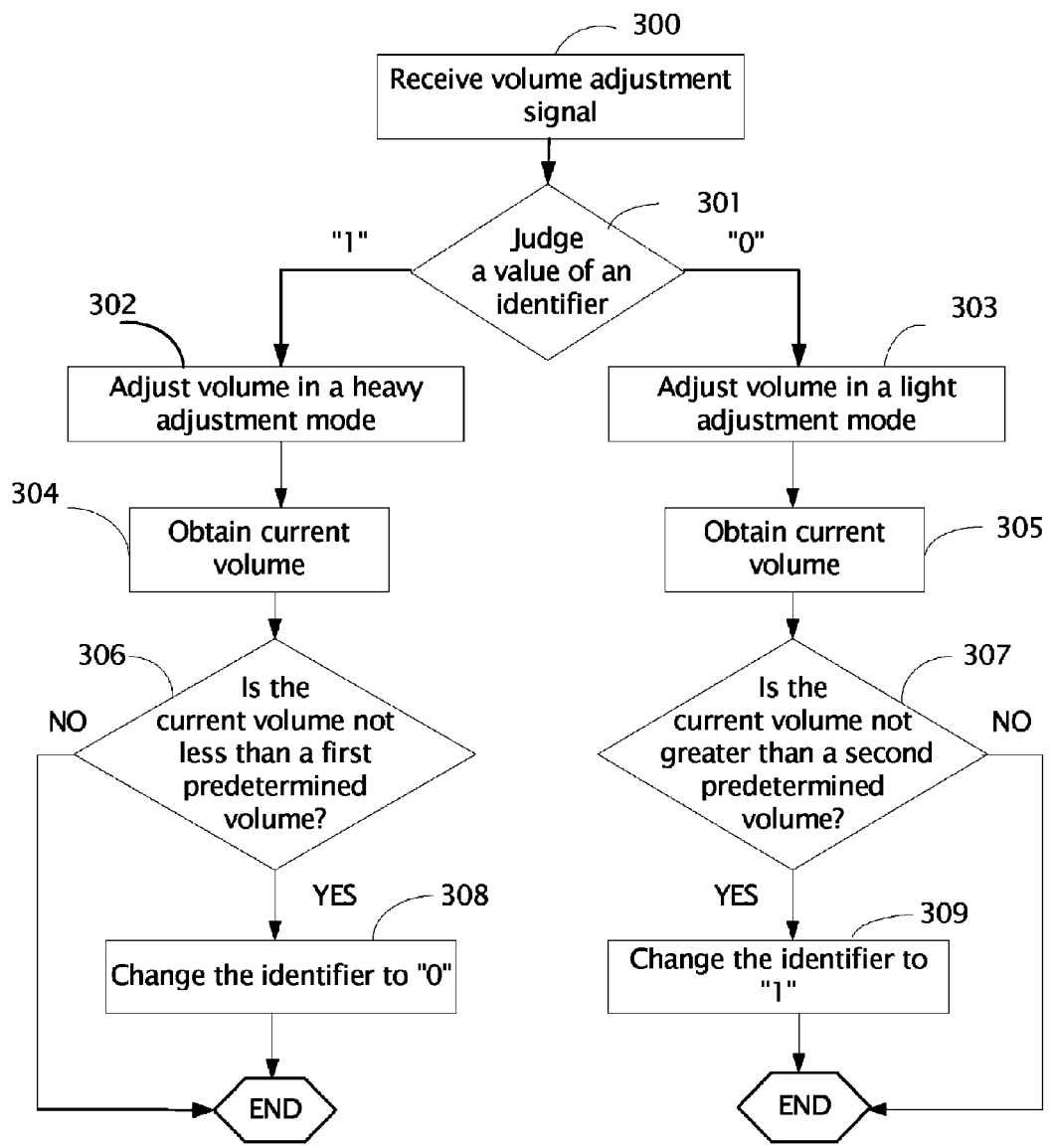
FIG. 3 is a flowchart illustrating a method for switching the volume adjustment mode implemented by the apparatus of FIG. 1.

FIG. 3 is a flowchart illustrating a method for switching the volume adjustment mode implemented by the apparatus of FIG. 1. In step S300, the input unit 40 generates a volume adjustment signal in response to the adjustment operations, and the control module 101 receives the volume adjustment signals.

In step S301, the control module 101 detects the value of the identifier.

If the value of the identifier is "1", namely when the adjustment mode is the heavy adjustment mode, in step S302, the control module 101 generates a heavy adjustment signal and transmits the heavy adjustment signal to the volume adjustment unit 20, the volume adjustment unit 20 adjusts the volume in large steps according to the heavy adjustment signal, namely adjusting the volume at larger increments/decrements (e.g., 10 db).

In step S304, the volume comparison module 102 obtains the current volume from the volume adjustment unit 20.

In step S306, the volume comparison module 102 compares the current volume with the first predetermined volume.

If the current volume is greater than or equal to the first predetermined volume, in step S308, the volume comparison module 102 switches the heavy adjustment mode to the light adjustment mode, namely where the volume comparison module 102 changes the value of the identifier from "1" to "0", and stores the value of the identifier in the memory 50.

If the control module 101 detects the value of the identifier is "0", in step S303, the control module 101 generates the light adjustment signal and transmits the light adjustment signal to the volume adjustment unit 20, the volume adjustment unit 20 adjusts the volume lightly according to the light adjustment signal, namely adjusting the volume at smaller increments/decrements (e.g., 1 db).

In step S305, the volume comparison module 102 obtains the current volume from the volume adjustment unit 20.

In step S307, the volume comparison module 102 compares the current volume with the second predetermined volume.

If the current volume is less than or equal to the second predetermined volume, in step S309, the volume comparison module 102 switches the light adjustment mode to the heavy adjustment mode, namely where the volume comparison module 102 changes the value of the identifier from "0" to "1", and stores the value of the identifier in the memory 50.

In addition, the first and second predetermined volumes can be set by the user.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An apparatus capable of switching a volume adjustment mode automatically, the apparatus comprising:
a volume adjustment unit;
an input unit for generating a volume adjustment signal in response to an adjustment operation;
a memory for storing an identifier and a first predetermined volume, wherein the identifier has a first value and a second value, the first value is configured for indicating a current volume adjustment mode is a heavy adjustment mode, and the second value is configured for indicating the current volume adjustment mode is a light adjustment mode;
a control module for receiving the volume adjustment signal and judging the value of the identifier, when the value of the identifier is the first value, generating a heavy adjustment signal to control the volume adjustment unit to adjust the volume in the heavy adjustment mode, and when the value of the identifier is the second value, generating a light adjustment signal to control the volume adjustment unit to adjust the volume in the light adjustment mode; and
a volume comparison module for obtaining current volume from the volume adjustment unit and comparing the current volume with the first predetermined volume, if the current volume is not less than the first predetermined volume and the current volume adjustment mode is the heavy adjustment mode, changing the value of the identifier from the first value to the second value, thereby switching the current adjustment mode from the heavy adjustment mode to the light adjustment mode;

wherein when the apparatus is in the heavy adjustment mode, the volume adjustment unit adjusts the volume with larger increments or decrements; and when the apparatus is in the light adjustment mode, the volume adjustment unit adjusts the volume with smaller increments or decrements.

2. The apparatus according to claim 1, wherein the memory further stores a second predetermined volume, the volume comparison module also compares the current volume with the second predetermined volume, if the current volume is not greater than the second predetermined volume and the current volume adjustment mode is the light adjustment mode, the volume comparison module changes the value of the identifier from the second value to the first value, thereby switching the current adjustment mode from the light adjustment mode to the heavy adjustment mode.

3. A method for switching a volume adjustment mode automatically, the method comprising:

obtaining a value of an identifier and judging the volume adjustment mode according to the value of the identifier in response to an adjustment operation;

judging the volume adjustment mode is a heavy adjustment mode in which the volume can be adjusted with larger increments or decrements and adjusting the volume in the heavy adjustment mode if the value of the identifier is a first value, or judging the volume adjustment mode is a light adjustment mode in which the volume can be adjusted with smaller increments or decrements and adjusting the volume in the light adjustment mode if the value of the identifier is a second value;

comparing the current volume with a first predetermined volume; and if the current volume is not less than the first predetermined volume and the current adjustment mode is the heavy adjustment mode, changing the value of the identifier from the first value to the second value, thereby switching the current adjustment mode from the heavy adjustment mode to the light adjustment mode.

4. The method according to claim 3, further comprising if the current volume is not greater than a second predetermined volume and the current adjustment mode is the light adjustment mode, changing the value of the identifier from the second value to the first value, thereby switching the current adjustment mode from the light adjustment mode to the heavy adjustment mode.

5. The method according to claim 4, further comprising adjusting the volume according to the current volume adjustment mode last change.

* * * * *